United States Patent
Kato et al.

[11] Patent Number: 5,849,603
[45] Date of Patent: Dec. 15, 1998

[54] METHOD OF PROCESSING A SURFACE OF A SEMICONDUCTOR SUBSTRATE

[75] Inventors: Hirotaka Kato; Yuji Sato; Kei Matsumoto, all of Hiratsuka, Japan

[73] Assignee: Komatsu Electronic Metals Co., Ltd., Hiratsuka, Japan

[21] Appl. No.: 626,852

[22] Filed: Apr. 2, 1996

[51] Int. Cl.⁶ ................................................. H01L 21/302
[52] U.S. Cl. ........................... 438/14; 438/745; 438/974; 134/1.3
[58] Field of Search ...................... 134/1.3, 3; 156/626.1, 156/662.1; 437/228 ST; 438/14, 745, 906, 974

[56] References Cited

U.S. PATENT DOCUMENTS

| | | | |
|---|---|---|---|
| 4,333,051 | 6/1982 | Goodman | 324/158 R |
| 4,507,334 | 3/1985 | Goodman | 427/93 |
| 4,598,249 | 7/1986 | Goodman et al. | 324/158 R |
| 5,238,500 | 8/1993 | Bergman | 134/3 |
| 5,298,860 | 3/1994 | Kato | 324/158 R |
| 5,308,400 | 5/1994 | Chen | 134/2 |
| 5,454,901 | 10/1995 | Tsuji | 156/643.1 |
| 5,486,266 | 1/1996 | Tsai et al. | 156/657.1 |

*Primary Examiner*—R. Bruce Breneman
*Assistant Examiner*—Anita Alanko
*Attorney, Agent, or Firm*—Varndell Legal Group

[57] ABSTRACT

A surface processing method for evaluating semiconductor substrate is intended to clean a semiconductor substrate, which has the surface of a silicon layer exposed by removing the epitaxial layer by an acid mixture, by buffered HF and then to perform SC-1 cleaning. Placing the substrate for about 2 hours after the processing, then the varying rate of the SPV value is quite stable at about 5%, so that the minor carrier diffusion length can be measured with high precision. Furthermore, the lead time of evaluating a semiconductor substrate can be significantly reduced over the prior-art method.

2 Claims, 5 Drawing Sheets

METHOD OF PROCESSING A SURFACE OF A SEMICONDUCTOR SUBSTRATE

BACKGROUND OF THE INVENTION

1. Field of the Invention

The present invention relates to a surface processing method for evaluating a semiconductor substrate.

2. Description of Prior Art

To assess the contamination of an epitaxial growth apparatus, after removing an epitaxial layer formed on a silicon wafer by using the epitaxial growth apparatus, the diffusion length of a minor carrier is measured by the surface photovoltage method (hereinafter referring to as SPV method) to assess the amount of contamination by heavy metals, such as Fe, Cr and so on. In case of performing the SPV method assessment, the epitaxial layer formed on the surface of the silicon wafer is etched away by using an acid mixture consisting of HF and $HNO_3$ or an acid mixture consisting of adding $H_2O$ or $CH_3COOH$ to HF and $HNO_3$, for pre-processing. For silicon wafers having a non-polished surface, such as as—slice wafers or lapped wafers, the acid mixture described above is used to etch the surface of silicon substrate to remove an oxide film and polish the surface.

However, right after the acid mixture is used to etch the surface of the substrate, or after buffered HF (hereinafter referring to as BHF) is used to clean the silicon substrate, the SPV value (surface photovoltage with unit of mV) is varied in accordance with the illumining time. FIG. 4 is a diagram obtained by sequentially plotting the variation of the ratio V(t)/V(0) where V(t) is SPV value t seconds after the beginning of illuminating and V(0) is SPV value at the beginning of illuminating in determining the diffusion length of the minor carrier by the SPV method. In the case of etching by the acid mixture, the V(t)/V(0) value is varied significantly for the first 15 seconds of illuminating, and the variation becomes large corresponding to the elapsed time in the case of BHF cleaning. On the other hand, when over one month has elapsed after being cleaned by SC-1 (Standard Cleaning-1), although the V(t)/V(0) value is varied according to the illuminating time, the variation is small. FIG. 5 is a curved diagram of 10 repeated measurements of the diffusion length of the minor carrier at the same measuring point of the silicon substrate being illuminated. The measured value immediately after etched by the acid mixture and cleaned by BHF is unstable since it is affected by the variation of V(t)/V(0). Therefore the etched silicon substrate is measured by the SPV method after left about one week. Hence, the lead time of the heavy metal contamination assessment by the SPV method is elongated and production efficiency of the semiconductor substrate is lowered.

SUMMARY OF THE INVENTION

Accordingly, the object of the present invention is to provide a surface processing method for evaluating a semiconductor substrate, which causes the SPV value to become stable in a short period of time.

To achieve the above object, the present invention provides a method of processing a surface of a semiconductor comprising steps of: etching the surface of the semiconductor to expose a silicon layer by using an acid mixture; cleaning a surface of the silicon layer by buffered HF; and then performing SC-1-cleaning for the surface of the silicon layer before assessing the contamination by heavy metals such as Fe and Cr of the silicon substrate, so as to stabilize a value of the diffusion length of a minor carrier measured by the SPV method.

The present invention provides a method of processing a surface of a semiconductor substrate having a non-polished surface, such as a lapped wafer, comprising steps of: cleaning the surface by buffered HF; and then performing SC-1 cleaning, so as to stabilize a value of the minor carrier diffusion length measured by the SPV method.

According to the above construction, a wafer in which has its epitaxial layer is removed, or an as-slice wafer or a lapped wafer is cleaned by BHF and then by SC-1, so that the SPV value of a semiconductor substrate can become stable in a short time period. On the other hand, cleaning the semiconductor substrate only by BHF, or cleaning the semiconductor substrate by BHF and by boiling water, or etching the semiconductor substrate by the acid mixture can not stabilize the above-mentioned SPV value in a short time period.

DESCRIPTION OF THE PREFERRED EMBODIMENTS

The following detailed description, given by way of example and not intended to limit the invention solely to the embodiments described herein, will best be understood in conjunction with the accompanying drawings.

Figure 1:
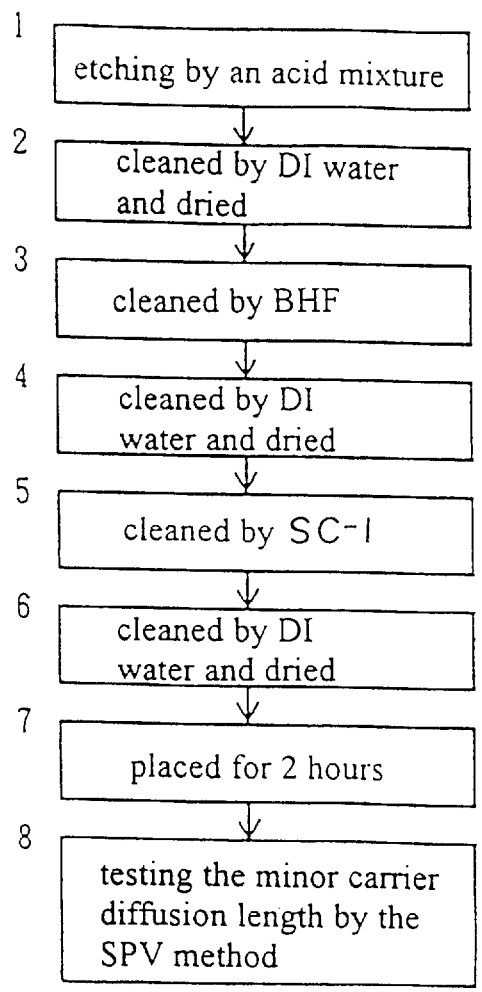
FIG. 1 is a flowchart illustrating the surface processing procedures for of measuring by the SPV method, the diffusion length of a minor carrier in a semiconductor substrateon which epitaxial layer formed.

In FIG. 1, the reference numbers at the upper left of each step in the drawing represent the numbers of the steps. In step 1, the semiconductor substrate is etched by an acid mixture to remove the epitaxial layer. The acid mixture consists of HF and $HNO_3$, or either $H_2O$ or $CH_3COOH$ added to HF and $HNO_3$. In step 2, the semiconductor substrate is cleaned by pure water and then dried. Subsequently, the semiconductor substrate is cleaned by BHF in step 3, and cleaned by pure water and dried in step 4, and then cleaned by SC-1 in step 5, in which SC-1 is composed by adding $H_2O$ into the solution of $NH_4OH$ and $H_2O_2$. The semiconductor substrate is cleaned by pure water again and dried in step 6, and left for 2 hours in step 7. In step 8, the diffusion length of a minor carrier in the semiconductor substrate processed by the above steps is measured by the SPV method.

The steps after the step 3 in FIG. 1 can be performed to measure the diffusion length of a minor carrier by the SPV method for a semiconductor substrate which has not formed an epitaxial layer thereon.

Figure 2:
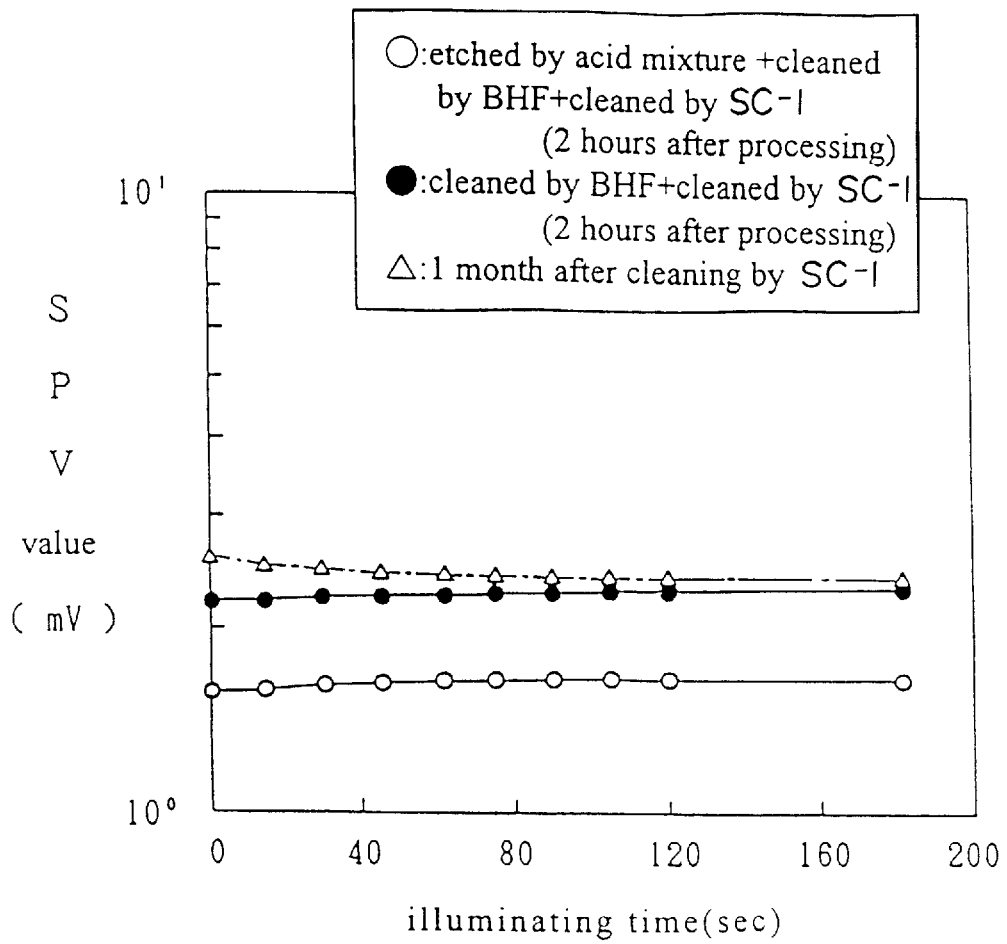
FIG. 2 is a diagram illustrating the variation of the SPV value corresponding to the illuminating time for the semiconductor substrate being surface processed according to the procedures shown in FIG. 1.

FIG. 2 is a diagram illustrating the variation curves of the SPV value corresponding to the illuminating time for the semiconductor substrate being surface processed according to the above steps. From the drawing, it is evident that the variation in SPV values for the semiconductor substrate (represented by ○ in the drawing), which is etched by the acid mixture, cleaned by BHF and SC-1, and left for 2 hours, and the semiconductor substrate (represented by ● in the drawing), which is cleaned by BHF and SC-1, and left for 2 hours, are small. They can result the same stable SPV value as the substrate (designated by a Δ in the drawing) leftover 1 month after cleaning by SC-1 which is illustrated for reference. The measured values shown in FIG. 2 respectively belong to different semiconductor substrates, thus, the SPV values are different.

Figure 3:
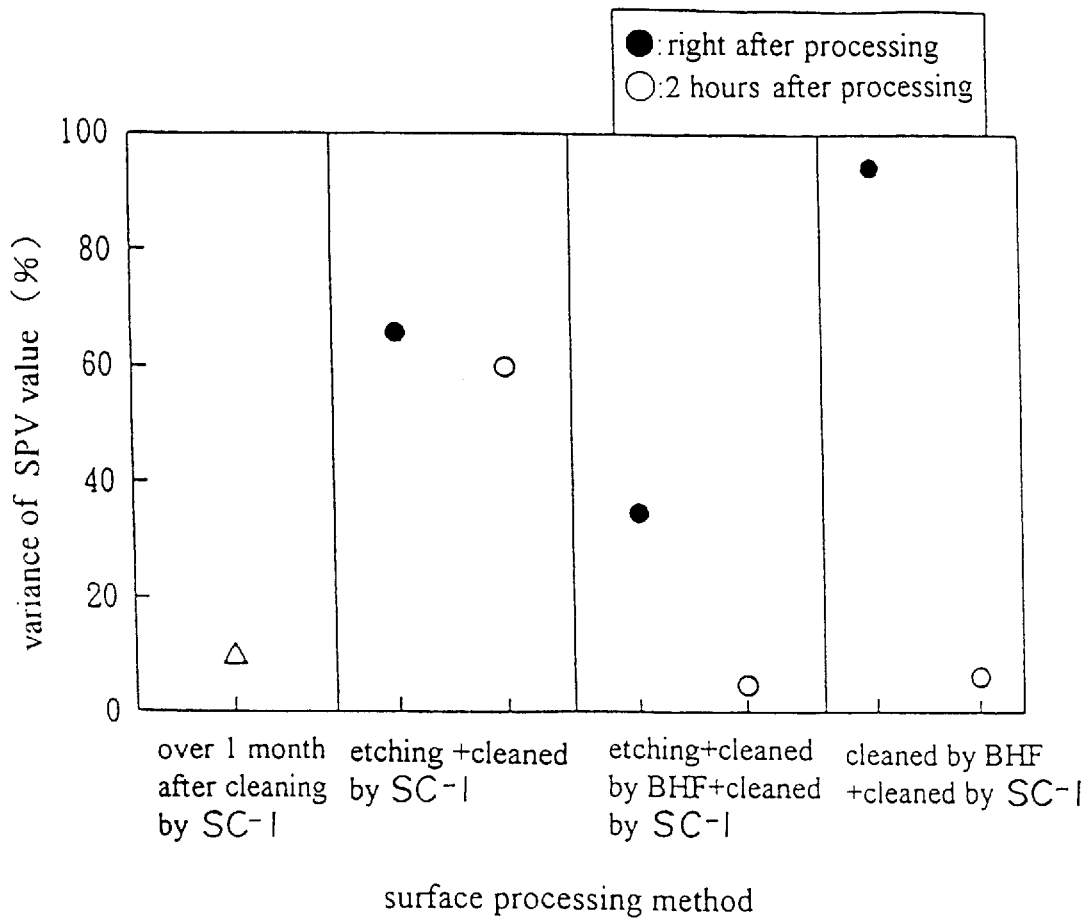
FIG. 3 is a diagram illustrating the varying rate of SPV values of after 3 minutes from illuminating for the different surface processing methods for the semiconductor substrate.
Figure 4:
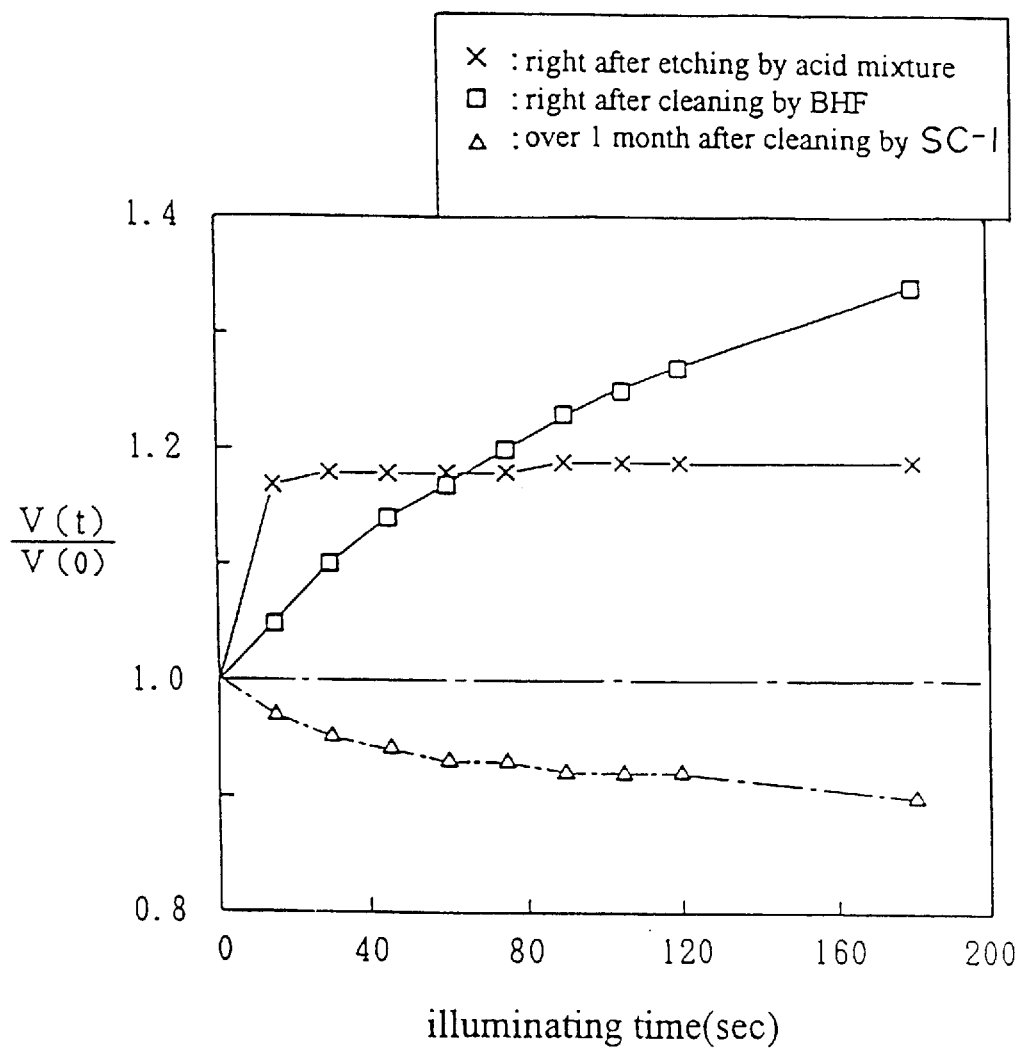
FIG. 4 is a diagram obtained by sequentially plotting the variation of the ratio V(t)/V(0) where V(t) is SPV value t seconds after the beginning of illuminating and V(0) is SPV value at the beginning of illuminating in determining the diffusion length of the minor carrier by the SPV method. diagram sequentially illustrating the variation of the ratio V(t)/V(0) of the SPV value V(t) t seconds from the beginning of illuminating and the SPV value V(0) at the beginning of illuminating during measurement of the minor carrier diffusion length by the SPV method.
Figure 5:
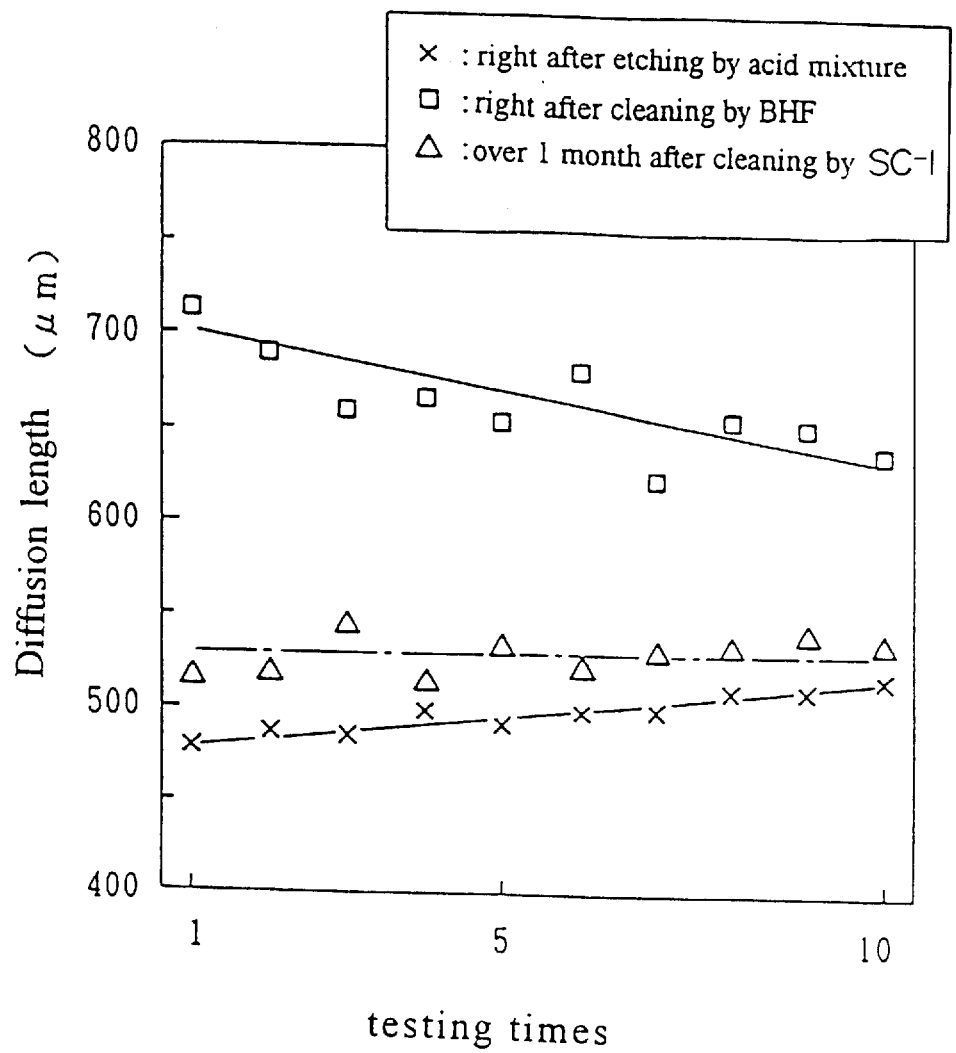
FIG. 5 is a diagram illustrating 10 repetitions of measuring the diffusion length of a minor carrier at the same measuring point of the semiconductor substrate as it is illuminated, with its surface being processed according to prior arts.

FIG. 3 is a diagram illustrating the varying rate in SPV values after 3 minutes of illuminating for different surface processing methods of the semiconductor substrate. The varying rate of the SPV value is expressed by the following equation:

the varying rate of SPV value (%) =[V(3 minutes)−V(0 minute)]/V(0 minute)×100 where V(0 minute) : the SPV value at the beginning of illuminating

V(3 minutes) : the SPV value after 3 minutes from illuminating

Moreover, the substrate (represented by Δ in the drawing) leftover 1 month after cleaning by SC-1 is illustrated for reference, wherein its varying rate in SPV value is 9.6%. The varing rate in SPV value is 66% immediately after etching by the acid mixture and cleaning by SC-1, and is 60% 2 hours after processing. On the other hand, cleaning by BHF and subsequently by SC-1 after etching or cleaning by BHF and subsequently by SC-1 produce better results. In other words, varying rates of SPV values immediately after processing, are 35% and 95% respectively, but drop to 5% and 6.4% after 2 hours. These values are about two thirds of the varying rate of 9.6% in the conventional method. Accordingly, by cleaning the semiconductor substrate by BHF and SC-1 and leaving it for about 2 hours, the present invention can measure the minor carrier diffusion length by the SPV method with a better accuracy than the conventional methods, and can reduce the left time (or waiting time) after surface processing to 2 hours, compared to about 1 week.

In performing the SPV measuring of the semiconductor substrate which is etched by an acid mixture and cleaned by BHF, a stable SPV value can be obtained according to the steps of FIG. 1, for growing the native oxide film, as a result the above silicon substrate need not be left for 1 week after employing the processing. However, since the SPV value becomes small due to cleaning by SC-1, the silicon substrate which cannot obtain a voltage of about 1 mV necessary for measuring should be left for about 1 week instead of being cleaned by SC-1 after surface processing.

As described above, according to the present invention, the surfaces of a wafer with the epitaxial layer being removed, and a lapped wafer having a non-polished surface can be cleaned by BHF and then by SC-1, hence the SPV values are very stable after being left for only about 2 hours following the above processing. The present invention can significantly reduce the lead time for evaluating a semiconductor substrate and raise the productivity of semiconductor substrate, compared with the prior-art method which is needed to leave a substrate for about 1 week after processing for obtaining a stable SPV value.

What is claimed is:

1. A method of processing a surface of a semiconductor to stabilize a value of a diffusion length of minority carriers measured by the SPV method, which comprises the steps of:

(1) cleaning the surface of the silicon layer with a buffered HF, (2) cleaning the surface of the silicon layer with a solution of $NH_4OH$ and $H_2O_2$, and (3) waiting two hours after step (2) and then assessing contamination of the semiconductor by the SPV method.

2. A method of processing a surface of a semiconductor to stabilize a value of a diffusion length of minority carriers measured by the SPV method, which comprises steps of:

(1) exposing a silicon layer by etching the surface of the silicon layer with an acid mixture, (2) cleaning the surface of the silicon layer with a buffered HF, (3) cleaning the surface of the silicon layer with a solution of $NH_4OH$ and $H_2O_2$, and (4) waiting two hours after step (3) and then assessing contamination of the semiconductor by the SPV method.

\* \* \* \* \*